(12) United States Patent
Payne et al.

(10) Patent No.: US 12,181,657 B2
(45) Date of Patent: Dec. 31, 2024

(54) REFLECTIVE TWO-DIMENSIONAL SPATIAL LIGHT MODULATORS

(71) Applicant: SILICON LIGHT MACHINES CORPORATION, San Jose, CA (US)

(72) Inventors: Alexander Payne, Ben Lommond, CA (US); James Hunter, Campbell, CA (US); Tianbo Liu, San Jose, CA (US)

(73) Assignee: SILICON LIGHT MACHINES CORPORATION, San Jose, CA (US)

( * ) Notice: Subject to any disclaimer, the term of this patent is extended or adjusted under 35 U.S.C. 154(b) by 400 days.

(21) Appl. No.: 17/591,858

(22) Filed: Feb. 3, 2022

(65) Prior Publication Data
US 2022/0252858 A1    Aug. 11, 2022

Related U.S. Application Data

(60) Provisional application No. 63/146,488, filed on Feb. 5, 2021.

(51) Int. Cl.
*G02B 26/00* (2006.01)
*G02B 26/02* (2006.01)
(Continued)

(52) U.S. Cl.
CPC ......... *G02B 26/001* (2013.01); *G02B 26/023* (2013.01); *G02B 26/0808* (2013.01); *G02B 26/0841* (2013.01); *G03F 7/70191* (2013.01)

(58) Field of Classification Search
CPC .......................... G02B 26/001; G02B 26/023; G02B 26/0808; G02B 26/0841; G03F 7/70191; G03F 7/70291; Y02P 10/25
See application file for complete search history.

(56) References Cited

U.S. PATENT DOCUMENTS

| | | | |
|---|---|---|---|
| 5,463,200 A | * | 10/1995 | James ................ B23K 26/0738 219/121.75 |
| 7,064,883 B2 | | 6/2006 | Payne et al. |

(Continued)

OTHER PUBLICATIONS

International Search Report for International Application PCT/US22/15301 May 3, 2022.
(Continued)

*Primary Examiner* — James C. Jones
(74) *Attorney, Agent, or Firm* — William Nuttle

(57) ABSTRACT

A high-contrast two-dimensional Micro-Electromechanical System light modulator and methods of fabricating and operating the same in various applications is provided. Generally, the light modulator includes a single, deformable membrane suspended over a surface of a substrate by posts at corners thereof, the deformable membrane including an electrostatically deflectable patterned central portion (CP) and a number of flexures through which the CP is coupled to the posts. A membrane reflector is formed on a surface of the CP, and a substrate reflector over a surface of the substrate, and the substrate reflector exposed through void spaces between the posts, flexures and CP. The light modulator is operable so that when the membrane reflector is deformed into a non-planar surface by electrostatic deflection of the CP, and light reflected from the membrane reflector is brought into phase interference with light reflected from the substrate reflector.

19 Claims, 12 Drawing Sheets

(51) Int. Cl.
  *G02B 26/08*  (2006.01)
  *G03F 7/00*  (2006.01)

(56) References Cited

U.S. PATENT DOCUMENTS

| | | |
|---|---|---|
| 7,227,687 B1 | 6/2007 | Trisnadi et al. |
| 7,277,110 B2 | 10/2007 | Zarem et al. |
| 11,016,287 B2 | 5/2021 | Payne et al. |
| 2011/0157010 A1 | 6/2011 | Kothari et al. |
| 2013/0050799 A1* | 2/2013 | Stowe ............... B41J 2/465 |
| | | 359/290 |
| 2016/0085067 A1 | 3/2016 | Payne et al. |
| 2018/0307039 A1 | 10/2018 | Payne et al. |
| 2020/0026027 A1 | 1/2020 | Lee |
| 2020/0026066 A1* | 1/2020 | Payne ............ G02B 26/0841 |

OTHER PUBLICATIONS

Written Opinion of International Searching Authority Application PCT/US22/15301 May 3, 2022.

* cited by examiner

| UV | 300-400nm | n | k | Lambda (nm) | Thk (nm) | Pairs | Reflectance % | Thickness Å |
|---|---|---|---|---|---|---|---|---|
| SiO2 | Silicon dioxide | 1.470 | 0 | 350 | 60 | - | | |
| Si3N4 | Silicon nitride | 2.112 | 0 | 350 | 41 | 5.5 | 94.2 | 5460 |
| ZrO2 | Zirconium oxide | 2.354 | 0 | 350 | 37 | 3.5 | 95.5 | 3280 |
| SiC | Silicon carbide | 2.856 | 0.113 | 350 | 31 | 3.5 | 87.9 | 3040 |

| VIS | 400-700nm | n | k | Lambda (nm) | Thk (nm) | Pairs | Reflectance % | Thickness Å |
|---|---|---|---|---|---|---|---|---|
| SiO2 | Silicon dioxide | 1.455 | 0 | 550 | 95 | - | | |
| SiN | Silicon nitride | 2.041 | 0 | 550 | 67 | 4.5 | 93.2 | 7150 |
| SiC | Silicon carbide | 2.673 | 0.0073 | 550 | 51 | 2.5 | 95.0 | 3430 |
| TiO2 | Titanium dioxide | 2.994 | 0 | 550 | 46 | 2.5 | 97.4 | 3280 |
| AlAs | Aluminum arsenide | 3.336 | 0.0077 | 550 | 41 | 2.5 | 98.5 | 3130 |

| NIR | 700-1000nm | n | k | Lambda (nm) | Thk (nm) | Pairs | Reflectance % | Thickness Å |
|---|---|---|---|---|---|---|---|---|
| SiO2 | Silicon dioxide | 1.456 | 0 | 850 | 146 | - | | |
| TiO2 | Titanium dioxide | 2.784 | 0 | 850 | 76 | 2.5 | 96.2 | 5200 |
| AlAs | Aluminum arsenide | 2.960 | 0 | 850 | 72 | 2.5 | 97.6 | 5080 |
| SiPoly | Polysilicon | 4.089 | 0.0169 | 850 | 52 | 2.5 | 99.4 | 2500 |

*FIG. 3C*

REFLECTIVE TWO-DIMENSIONAL SPATIAL LIGHT MODULATORS

CROSS-REFERENCE TO RELATED APPLICATIONS

This application claims the benefit of priority under 35 U.S.C. 119(e) to U.S. Provisional Patent Application Ser. No. 63/146,488, filed Feb. 5, 2021, which is incorporated by reference herein in its entirety.

TECHNICAL FIELD

The present invention relates generally to spatial light modulators (SLMs), and more particularly to SLMs including Reflective two-dimensional (2D) microelectromechanical systems (MEMS) light modulators, and methods for fabricating and operating the same in various applications.

BACKGROUND

Spatial light modulators or SLMs include an array of one or more devices that can control or modulate an incident beam of light in a spatial pattern that corresponds to an electrical input to the devices. The incident light beam, typically generated by a laser, can be modulated in intensity, phase, polarization or direction. Spatial light modulators are increasingly being developed for use in various applications, including display systems, optical information processing and data storage, printing, maskless lithography, 3D printing, additive manufacturing, surface modification and optical phase light modulators.

One type of spatial light modulator (SLM) potentially useful in the aforementioned applications is a SLM including an array of microelectromechanical systems (MEMS) light modulators having one or more dynamically adjustable reflective surfaces or mirrors mounted over a substrate. Existing MEMS based SLMs include digital micromirror devices (DMDs), commercially available from Texas Instruments, and liquid crystal light modulators, Grating or Grated Light Valves (GLV™), and Planar Light Valves (PLV™), both of which are commercially available from Silicon Light Machines, Inc., of Sunnyvale, California.

Unfortunately, existing MEMs light modulators have a number of problems or shortcomings that limit or prohibit their use in many applications. Firstly, fabricating MEMs light modulators involves forming microscopic and nanometer scale devices including multiple static and movable, tensile light reflective surfaces in multiple different layers or heights above a surface of the substrate. Typically, fabrication is a complex, process involving deposition, patterning and removal of numerous different material layers. It is costly and time consuming often with a low yield of working light modulators.

A second problem with conventional MEMs light modulators is their inability to handle the high power lasers employed in laser processing systems for applications including cutting, marking, engraving, and 3D printing. Typically, the failure mode of these devices when exposed to high power or temperature lasers is the "Soret effect" in which atoms of a reflective metal, such as aluminum, covering reflective surfaces in the MEMs based SLM physically migrate along from a hotter to a cooler region of the ribbon. This migration of metal atoms can reduce the reflection and hence the efficiency of the SLM, and ultimately shortens useful device life.

Accordingly, there is a need for MEMs light modulators capable of being fabricated using with a more robust and simplified process to provide higher yields. There is a further need for MEMs light modulators with high-power handling capabilities.

SUMMARY

Spatial light modulators (SLMs) including a number of reflective two-dimensional (2D) microelectromechanical systems (MEMS) light modulators or diffractors having a reflective layer on a single membrane suspended over a surface of a substrate, and methods for fabricating and operating the same in various applications are described. The 2D MEMS light modulators include a single, deformable membrane suspended over a surface of a substrate by posts at corners thereof, the deformable membrane including an electrostatically deflectable patterned central portion (CP) and a number of flexures through which the CP is coupled to the posts. A membrane reflector including a deformable reflective surface is formed on a surface of the CP, and a substrate reflector including a static reflective surface formed over a surface of the substrate, and exposed through void spaces between the posts, the number of flexures and the CP. The light modulator is operable so that when the deformable reflective surface is deformed into a non-planar surface by electrostatic deflection of the CP light reflected from the membrane reflector is brought into phase interference with light reflected from the substrate reflector.

Generally, the 2D MEMS light modulators are configure or operable such that an integrated phase angle of light reflected from the substrate reflector (phasor $\tilde{A}_{subst}$) is an even multiple of $2\pi$; and an integrated phase angle of light reflected from the membrane reflector (phasor $\tilde{A}_{memb}$) is an even multiple of $\pi$ to provide a high-reflectance from the 2D MEMS light modulator in a quiescent state, or an odd multiple of $\pi$ to provide a low-reflectance from the 2D MEMS light modulator in the quiescent state. In one embodiment, the membrane reflector and substrate reflector are sized and shaped and the 2D MEMS light modulator is operable so that in an active state with the deformable reflective surface is deformed by electrostatic deflection of the CP, phasors $\tilde{A}_{subst}$ and $\tilde{A}_{memb}$ cancel to achieve low-reflectance dark state. In another embodiment, the membrane reflector and substrate reflector are sized and shaped and the 2D MEMS light modulator is operable so that in an active state with the deformable reflective surface is deformed by electrostatic deflection of the CP, phasors $\tilde{A}_{subst}$ and $\tilde{A}_{memb}$ add to achieve a high-reflectance bright state. In either embodiment a reflected intensity of light reflected from the 2D MEMS light modulator is approximately equal to a square of a net sum phasors $\tilde{A}_{subst}$ and $\tilde{A}_{memb}$. It is noted that, unlike in previous generations of 2D MEMS light modulators the first and substrate reflectors need not satisfy an equal area constraint. However, it is desirable that the phasors $\tilde{A}_{subst}$ and $\tilde{A}_{memb}$ are substantially equal to cancel in for the low-reflectance dark state to achieve a high-contrast.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the present invention will be understood more fully from the detailed description that follows and from the accompanying drawings and the appended claims provided below, where:

FIG. 3C is a table giving a lowest absorption (k), and greatest index difference (n) and percent reflectance of different materials for use in a distributed or Bragg mirror in the ultraviolet (UV), visible (VIS) and near infrared (NIR) wavelengths;

DETAILED DESCRIPTION

The present disclosure is directed to spatial light modulators (SLM) including reflective two-dimensional (2D) microelectromechanical systems (MEMS) light modulators, and methods for fabricating and operating the same in various applications. In particular, it has been found that reflective 2D MEMS light modulators provides improved yield in fabricating and performance with contrast ratios (CR) of a thousand (1000) and increased power handling capability due to a reduced thermal resistance of the reflective 2D MEMS light modulator including a single, deformable reflective layer suspended over a planar reflective on a substrate In the following description, numerous specific details are set forth, such as specific materials, dimensions and processes parameters etc. to provide a thorough understanding of the present invention. However, particular embodiments may be practiced without one or more of these specific details, or in combination with other known methods, materials, and apparatuses. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 1:
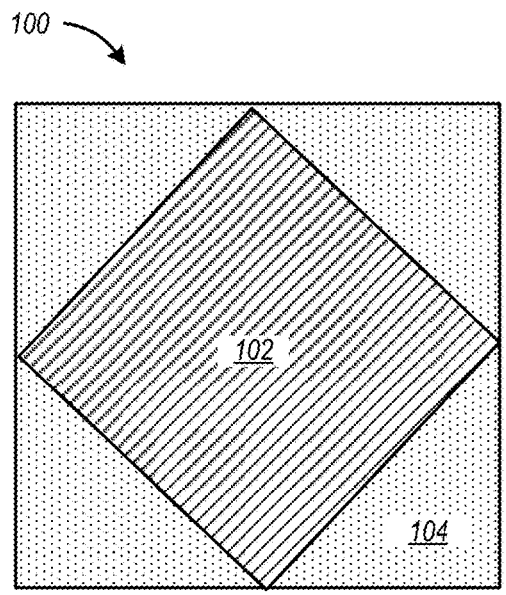
FIG. 1 is a simplified schematic diagram illustrating a top view of an ideal two-dimensional (2D) light modulator.

FIG. 1 is a simplified schematic diagram illustrating a top view of an ideal light modulator 100 including a movable, first reflective surface 102 suspended above or surrounded by a static, second reflective surface 104. In the ideal light modulator 100 shown in FIG. 1, both the first reflective surface 102 and the second reflective surface 104 are completely planar and equal in area. In operation a light incident on the ideal light modulator 100 is reflected from the second reflective surface 104 at a first phase (0), and from the first reflective surface 102 at one of a number of second phases from (0-π) depending on a distance by which the first reflective surface has been moved or displaced relative to the second reflective surface. When the first reflective surface 102 is displaced by a distance equal to an odd multiple of one quarter (¼) wavelength of the incident light, the light reflected from the first reflective surface is brought into destructive interference with light reflected from the second reflective surface 104 and the ideal light modulator 100 is in a low-reflectance or dark state. When the first reflective surface 102 is coplanar with the second reflective surface 104, or displaced by an even multiple of one quarter (¼) wavelength of the incident light, the light reflected from the first reflective surface is brought into constructively interferes with light reflected from the second reflective surface and the ideal light modulator 100 is in a high-reflectance or bright state.

It will be appreciated that realization of an ideal light modulator 100 is not possible or practicable because of the need for structures to displace or deflect the first reflective surface 102.

Figure 2A:
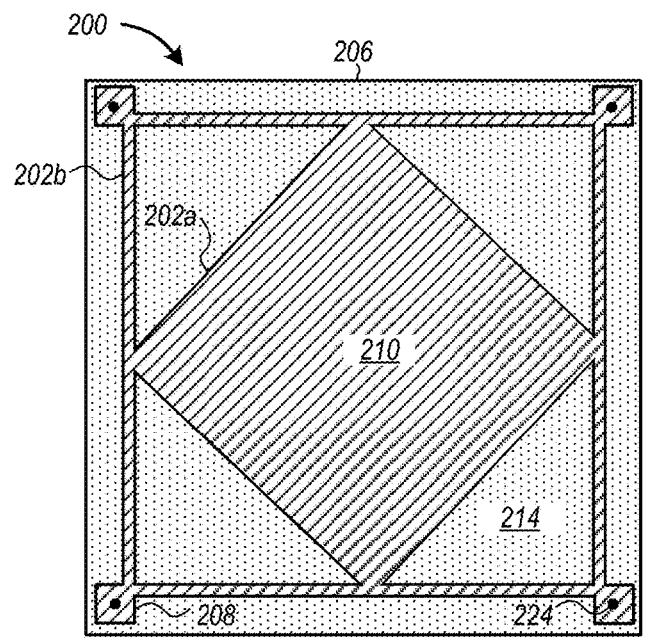
FIG. 2A is a simplified schematic diagram illustrating a top view of a 2D microelectromechanical systems (MEMS) light modulator including a single, deformable reflective layer suspended over a planar reflective on a substrate.
Figure 2B:
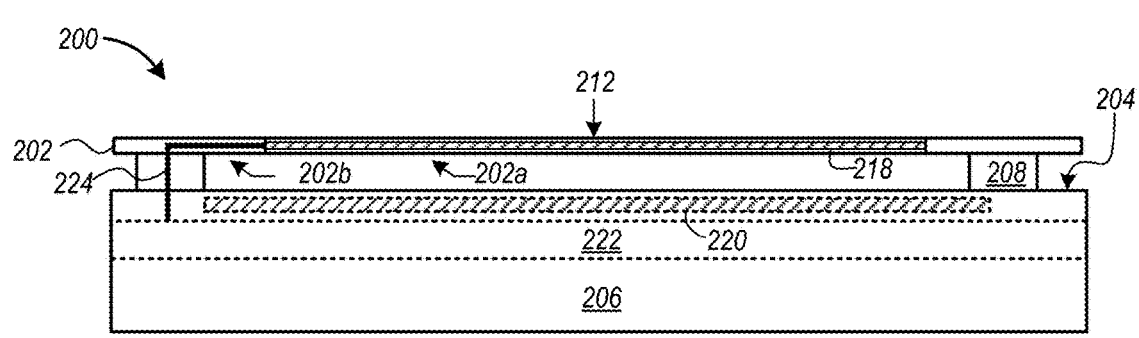
FIG. 2B is a simplified schematic diagram illustrating a sectional side view of the 2D MEMS light modulator of FIG. 2A in a quiescent or undriven state.
Figure 2C:
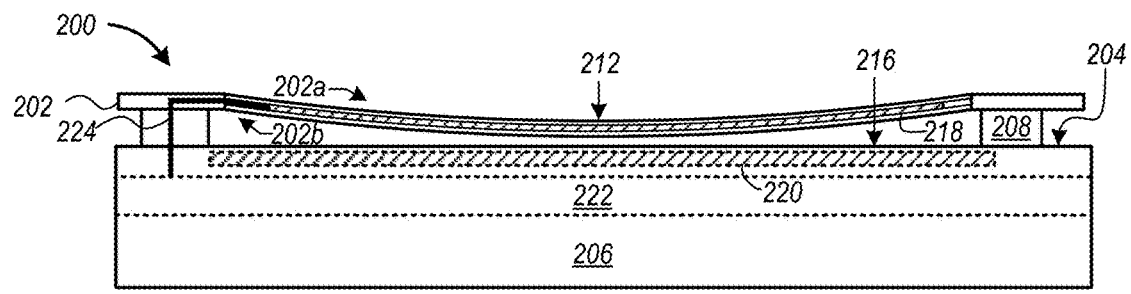
FIG. 2C is a simplified schematic diagram illustrating a sectional side view of the 2D MEMS light modulator of FIG. 2B in an active or driven state.

An actual single-layer, reflective two-dimensional (2D) microelectromechanical systems (MEMS) light modulator, which can be designed, fabricated and operated in accordance with embodiments of the present disclosure, will now be described with reference to FIGS. 2A through 2C. By single-layer it is meant a 2D MEMS light modulator including a single deformable layer or membrane having a reflective surface and suspended over a surface of a substrate. Generally, the 2D MEMS light modulator further includes a static reflective surface formed on the substrate surface as shown in FIGS. 2A through 2C. Alternatively, as described in detail below, the static reflective surface may be formed on a membrane or structure(s) formed above the substrate surface and above or below the single deformable reflective layer.

FIG. 2A is a top view of a reflective 2D MEMS light modulator 200, and FIG. 2B is a sectional side view of the light modulator in a quiescent or undriven state. Referring to FIGS. 2A and 2B, the reflective 2D MEMS light modulator 200 includes a deformable membrane 202 suspended over a surface 204 of a substrate 206 by posts 208 at corners thereof. The deformable membrane 202 includes an electrostatically deflectable patterned central portion (CP 202a) and a number of flexures 202b through which the CP is coupled to the posts 208. The reflective 2D MEMS light modulator 200 further includes a membrane reflector 210 including a deformable reflective surface 212 formed on a top surface of the CP 202a, and a substrate reflector 214 including a static reflective surface 216 formed over a surface of the substrate 206, and exposed through void spaces between the posts 208, flexures 202b and the CP.

In operation displacement or deflection of the CP 202a is accomplished by electrostatic forces generated between an actuator electrode 218 formed in or on the CP and a substrate electrode 220 in the substrate 206. Generally, the substrate electrode 220 is coupled to one of a number drive channels in a drive circuit or driver 222, which can be integrally formed in the substrate 206 underlying the 2D MEMS light modulator 200, as in the embodiment shown, or adjacent thereto. The actuator electrode 218 can also be coupled to the driver 222 or to an electrical ground through a conductor 224 extending through one or more of the posts 208 and the deformable membrane 202. As explained in greater detail below with reference to FIG. 4, typically multiple individual 2D MEMS light modulators 200 are grouped or ganged together under control of a single drive channel to function as a single pixel in a multi-pixel, linear array of light modulators 2D light modulators of a spatial light modulator (SLM).

The 2D MEMS light modulator 200 is operable so that electrostatic deflection of the CP 202a causes the deformable reflective surface 212 is displaced so that light reflected from the membrane reflector 210 is brought into phase interference with light reflected from the substrate reflector 214. FIG. 2C is a simplified schematic diagram illustrating a sectional side view of the 2D MEMS light modulator of FIG. 2B in an active or driven state. It is noted that unlike in the ideal light modulator 100 of FIG. 1, the membrane reflector 210 deforms into a curved complex phase surface as it is displaced or actuated. Thus, unlike in the ideal light modulator 100 it is not necessary that the membrane reflector 210 and the substrate reflector 214 have equal areas, but rather phasor sums of light reflected from each reflector should cancel for high contrast when the membrane reflector 210 is displaced or deflected to bring the 2D MEMS light modulator 200 into the low-reflectance or dark state.

The integrated phase angle of the substrate phasor ($\tilde{A}_{subst}$) of light reflected from the substrate reflector 214 is given by equation 1 below:

$$\tilde{A}_{subst} = \int_{subst} dA * \exp(-4\pi i d / \lambda) \rightarrow \tilde{A}_{subst} = A_{subst}\exp(-m \cdot \pi i) \quad \text{(Eq. 1)}$$

where A is an area of the substrate region or reflector, d is the reference surface and d=0, $\lambda$ is wavelength of the incident light and m is an even integer.

The integrated phase angle of the substrate phasor ($\tilde{A}_{memb}$) of light reflected from the membrane reflector 210 is given by equation 2 below:

$$\tilde{A}_{memb} = \int_{memb} dA * \exp(-4\pi i d / \lambda) \rightarrow \tilde{A}_{memb} = A_{memb}\exp(-n \cdot \pi i) \quad \text{(Eq. 2)}$$

where A is an area of the membrane reflector, d is the elevation relative to the substrate, $\lambda$ is wavelength of the incident light and n is an even integer (bright state) or odd integer (dark state).

Generally, a reflected intensity (I) of light reflected from the 2D MEMS light modulator 200 is the square of a net sum of these phasors $\tilde{A}_{subst}$ and $\tilde{A}_{memb}$, that is (I=[$\tilde{A}_{subst}$+$\tilde{A}_{memb}$]$^2$). The membrane reflector 210 and substrate reflector 214 are sized and shaped such that under appropriate drive condition the integrated phasor of light reflected from the substrate reflector (phasor $\tilde{A}_{subst}$) and the integrated phasor of light reflected from the membrane reflector sum in phase to provide a high-reflectance bright state ($\tilde{A}_{subst}$+$\tilde{A}_{memb}$=$\tilde{A}$≈1). Under different drive conditions, the 2D light modulator can be configured or operable to so that the integrated phasor of light reflected from the substrate reflector (phasor $\tilde{A}_{subst}$) and the integrated phasor of light reflected from the membrane reflector in anti-phase to provide a low-reflectance dark state ($\tilde{A}_{subst}$+$\tilde{A}_{memb}$=$\tilde{A}$≈0).

By controlling the film thicknesses between the surfaces of the substrate and the membrane, the quiescent (undeflected) state of the device can be either bright or dark. For example, the 2D light modulator can be configured such that phasors $\tilde{A}_{subst}$ and $\tilde{A}_{memb}$ add constructively to achieve a high-reflectance bright quiescent state ($\tilde{A}_{subst}$+$\tilde{A}_{memb}$=$\tilde{A}$≈1). Alternatively, with a different quiescent separation, the phasors can be configured to add destructively to achieve a low-reflectance dark quiescent state ($\tilde{A}_{subst}$+$\tilde{A}_{memb}$=$\tilde{A}$≈1).

Referring again to FIGS. 2A through 2C, the substrate 206 can be a wafer of any material suitable for the manufacture of microelectronic devices, including, for example, silicon, gallium-arsenide, lithium-tantalate crystal, and other such semiconducting and dielectric materials. Generally, the deformable membrane 202 and posts 208 can include silicon (Si), silicon-nitride (SiN), silicon-germanium (SiGe), aluminum (Al), aluminum-silicon (AlSi), and aluminum-nitride (AlN). Materials of the deformable reflective surface 212 and static reflective surface 216 are selected so that the 2D MEMS light modulator 200 is operable to modulate light ranging from deep ultraviolet light (DUV) to near-infrared (NIR) at wavelengths from 150 nm to 2 μm. Suitable reflective materials can include aluminum (Al), gold (Au), silver (Ag) or any other suitably reflective metal.

Figure 3A:
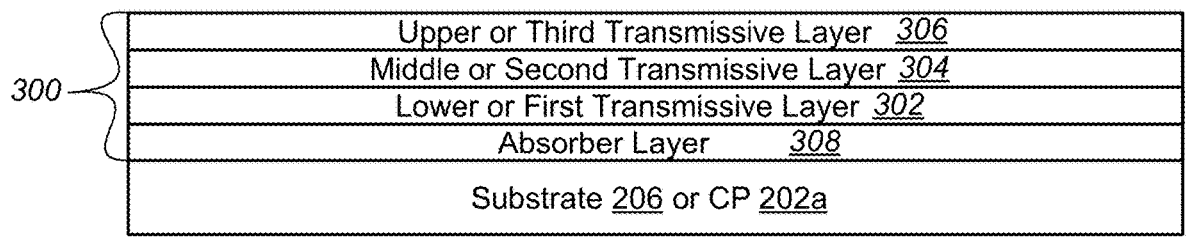
FIG. 3A schematic sectional side view of a stack of layers in a distributed or Bragg mirror for use in a reflective 2D MEMS light modulator.

Alternatively, one or both of the deformable reflective surface 212 and static reflective surface 216 can include a multilayer distributed or Bragg mirror 300 including one or more alternating layers with different optical characteristics or properties, such as reflection, transmission and absorption depending on the wavelengths of the incident light being modulated. FIG. 3A show an embodiment of a Bragg mirror including a first or lower transmissive layer 302 overlying the CP 202a (or surface of the substrate 206) of a reflective 2D MEMS light modulator 200, a middle transmissive layer 304 on the first or lower transmissive layer, and a third or top transmissive layer 306 on the second or middle transmissive layer. The thicknesses of these layers are adjusted so as to comprise one quarter wave of the wave of the target wavelength. Suitable materials for the transmissive layers can include poly-crystalline silicon, silicon-oxide, silicon-carbide, aluminum-arsenide, zirconium-oxide and titanium-oxide. Optionally, in certain embodiments, such as that shown in FIG. 3A, the Bragg mirror 300 further includes an absorbing layer 308 to absorb and re-emit, or reflect incident light. Suitable materials for the absorbing layer 308 can include metallic films as well as native or doped semiconductors. The enhanced reflectivity of a stack of two or more transmissive layers over an absorbing layer reduces or substantially eliminates degradation of the reflective 2D MEMS light modulator 200 as a consequence of high laser fluence.

Figure 3B:
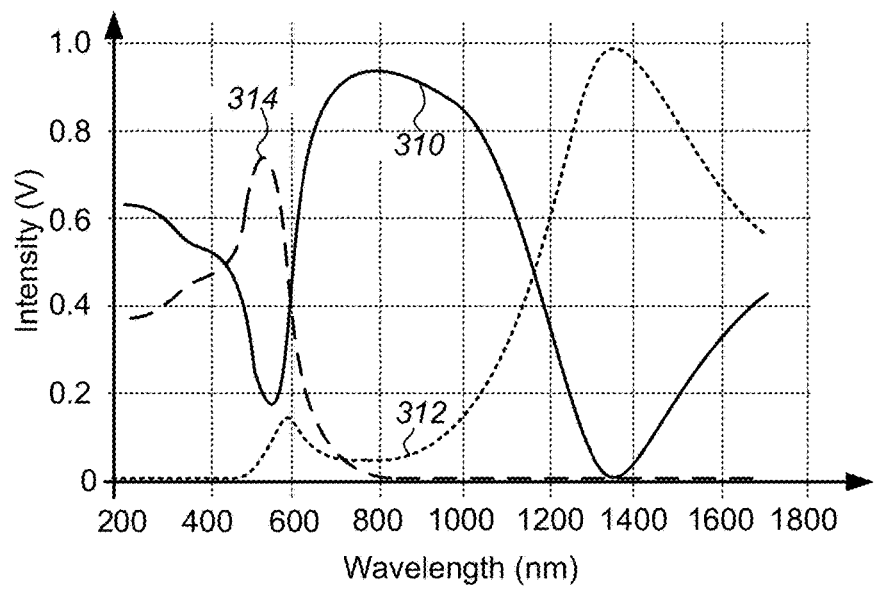
FIG. 3B is a graph illustrating the reflection, transmission and absorption of a distributed or Bragg mirror including alternating layers of silicon-dioxide and poly-crystalline silicon at near-infrared (NIR) wavelengths.

FIG. 3B is a graph illustrating a reflection 310, transmission 312 and absorption 314 of a distributed or Bragg mirror 300 including alternating transmissive layers of poly-crystalline silicon, silicon-dioxide and poly-crystalline silicon at near-infrared (NIR) wavelengths of from about 700 to 1000 nanometers (nm). Referring to FIG. 3B it is seen that a Bragg mirror including a first transmissive layer of 56 nm poly-crystalline silicon, a second transmissive layer of 68 nm silicon-dioxide and a top reflective layer of 56 nm poly-crystalline silicon, a second reflective layer of 68 nm silicon-dioxide exhibits a total reflection of about 95% at or near a center wavelength of 800 nm.

FIG. 3C is a table giving the lowest absorption (k), and greatest index difference (n) and percent reflectance of different materials for use in a distributed mirror in the ultraviolet (UV), visible (VIS) and near infrared (NIR) wavelengths.

Figure 4:
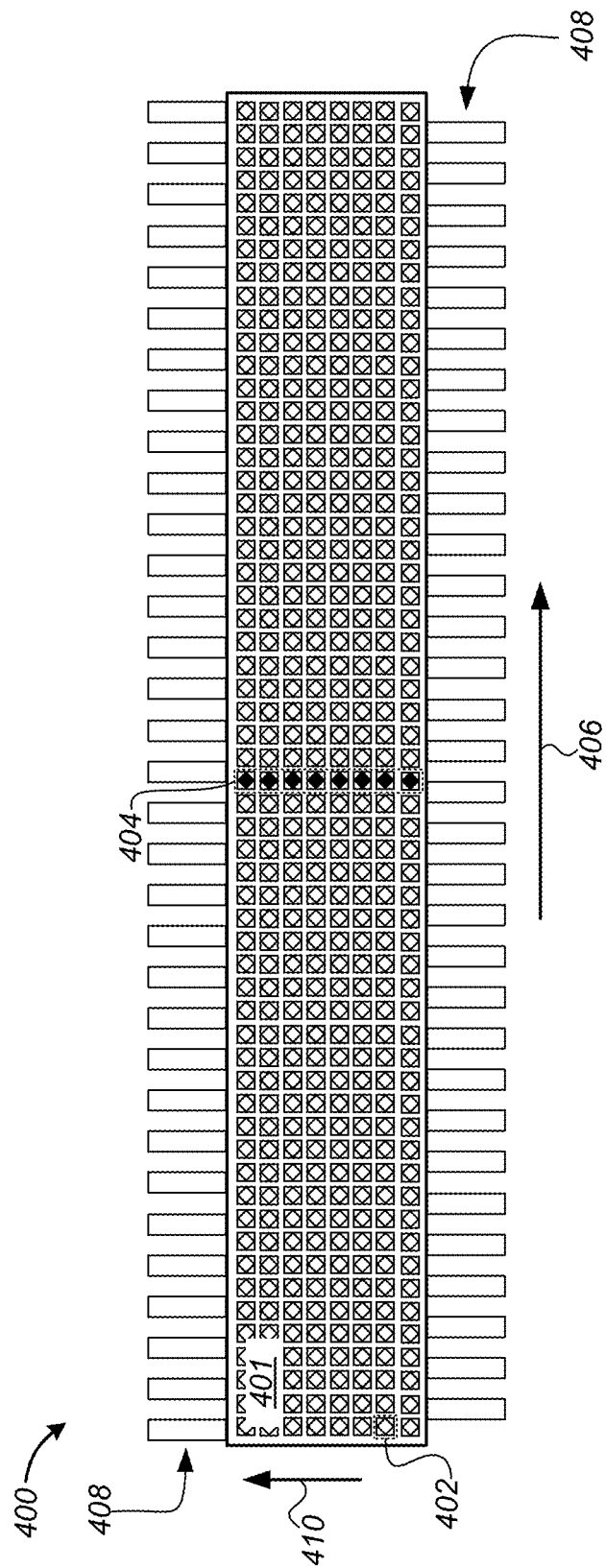
FIG. 4 is a schematic block diagram of a top view of a spatial light modulator (SLM) including a multi-pixel, linear array of reflective 2D MEMS light modulators, such as those shown in FIGS. 2A-2C.

An exemplary multi-pixel, linear array of dense-packed, Reflective 2D MEMS light modulators will now be described with reference to the block diagram of FIG. 4. FIG. 4 is a planar top view of a SLM 400 including a linear array 401 of 2D light modulators 402, such as those shown and described above, grouped or coupled together to a number of drive channels to or pixels.

Referring to FIG. 4, in one embodiment the 2D light modulators 402 are grouped into a linear array 401 of interleaved channels or pixels 404 along a first, horizontal or longitudinal axis 406. Each of the 2D light modulators 402 in a single pixel 404 share a common drive channel or driver 408. Although in the embodiment shown each pixel 404 is depicted as having a single column of 8 2D light modulators 402 grouped along a vertical or transverse axis 410 perpendicular to the horizontal or longitudinal axis 406 of the array, this is merely to facilitate illustration of the array. It will be appreciated that each channel or pixel can include any number of 2D light modulators arranged in one or more columns of any length across the width or vertical or transverse axis of the array without departing from the spirit and scope of the invention. Similarly, the SLM 400 can include a linear array 401 of any number of pixels 404 or a number of individual linear arrays 401 placed end to end adjacent to one another. This later configuration can help to increase power handling of the SLM 400 as the optically active area of the linear array 401 gets larger by increasing the number of columns of light modulators per pixel. If the damage threshold per light modulator is constant, power handling can be increased proportional to the area increase.

In order to maximize or provide sufficient contrast for the SLM 400 it is desirable that incident light from an illumination source, have a numerical aperture (NA) or cone angle (Θ) which is smaller than the first-order diffraction angle (θ) of the diffractive SLM 400. The diffraction angle (θ) of the SLM is defined as the angle between light reflected from a pixel 404 in the $0^{th}$ order mode or state, and light reflected from the same pixel in the plus and/or minus $1^{st}$ order mode. However, according to the grating equation, diffraction angles of a periodic surface, such as the linear array 401 of the SLM 400, are set by a ratio of wavelength of light incident on the array to a spatial period or pitch of features of the periodic surface, i.e., the pixels 404. In particular, the grating equation, equation 3 below, states:

$$\sin\theta = m\lambda/\Lambda \qquad (3)$$

where θ is a diffraction angle of light reflected from the surface, m is order of diffracted ray (integer), λ is the wavelength of the incident light, and Λ is a spatial or pitch of the 2D light modulator 402. When we focus on a single pixel which has multiple 2D light modulators 402 and the incident light is ideal plane wave or has a numeric aperture (NA)=0, the light spreads due to Huygen-Fresnel principle. The spreading angle Θ is defined by equation 4 below as:

$$\Theta = \lambda/D \qquad (4)$$

where D is a pixel size.

Figure 5:
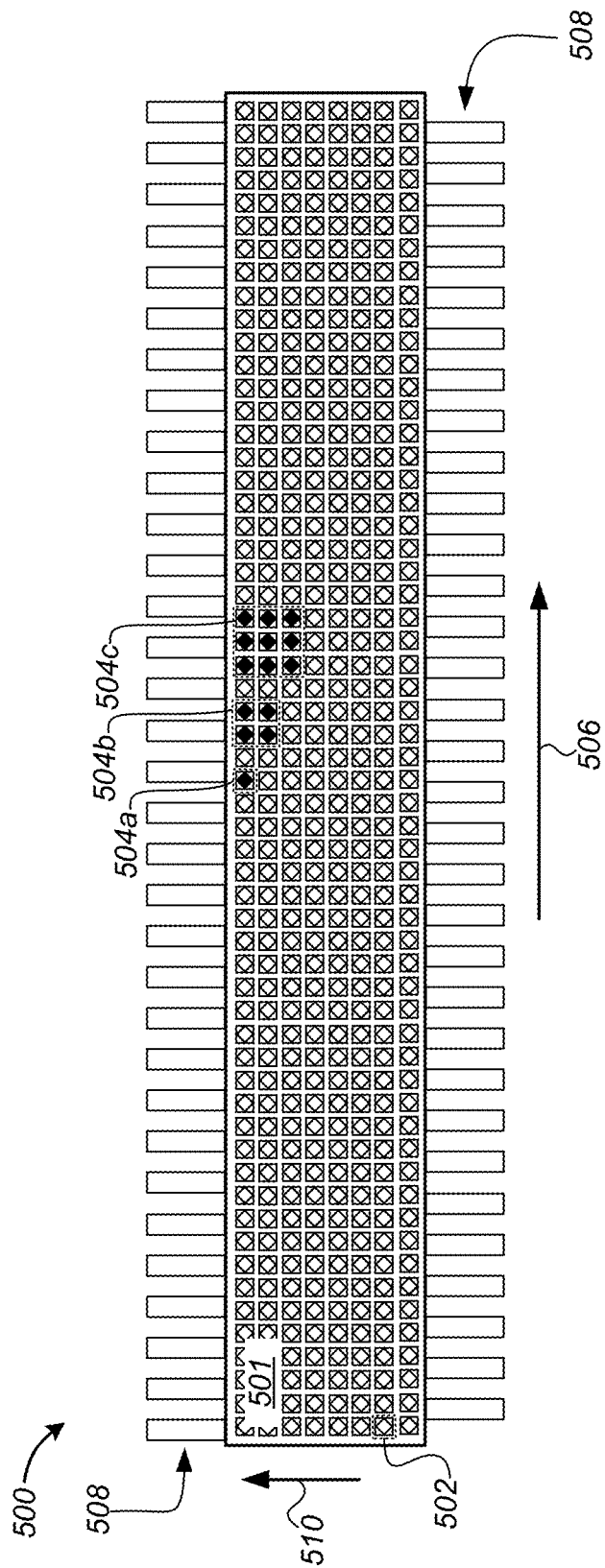
FIG. 5 is a schematic block diagram of a top view of another embodiment of a fully programmable SLM including a linear array of reflective 2D MEMS light modulators that can grouped or ganged together into pixels including any number of individual modulators.

In another embodiment the SLM can include a fully programmable linear array of reflective 2D MEMS light modulators, such as a 2D PLV™, that can grouped or ganged together into pixels including any number of individual modulators. Referring to FIG. 5, in the embodiment shown the SLM 500 includes 2D light modulators 502 are arranged in a rectangular array 501 along a first, horizontal or longitudinal axis 506 a second, vertical or transverse axis 510, and the SLM 500 is programmed so that each of the 2D light modulators 502 are grouped or ganged into to form multiple pixels, each including the same number of the 2D light modulators 502. By programmable it is meant that the number of individual the 2D light modulators 502 in each pixel may be set or programmed to sharing a common drive channel or driver 508. For example, in the embodiment shown a pixel 504a may consist of a single the 2D light modulators 502, four the 2D light modulators (pixel 504b), nine the 2D light modulators (pixel 504c), or more.

A method for fabricating a reflective 2D MEMS light modulator according to the present disclosure will now be described with reference to the flow chart of FIG. 6, and FIGS. 7A-7I. FIGS. 7A-7I are cross-sectional and/or top views illustrating an embodiment of the fabrication process for a reflective 2D MEMS light modulator 700 according to a method of the flow chart of FIG. 6.

Figure 6:
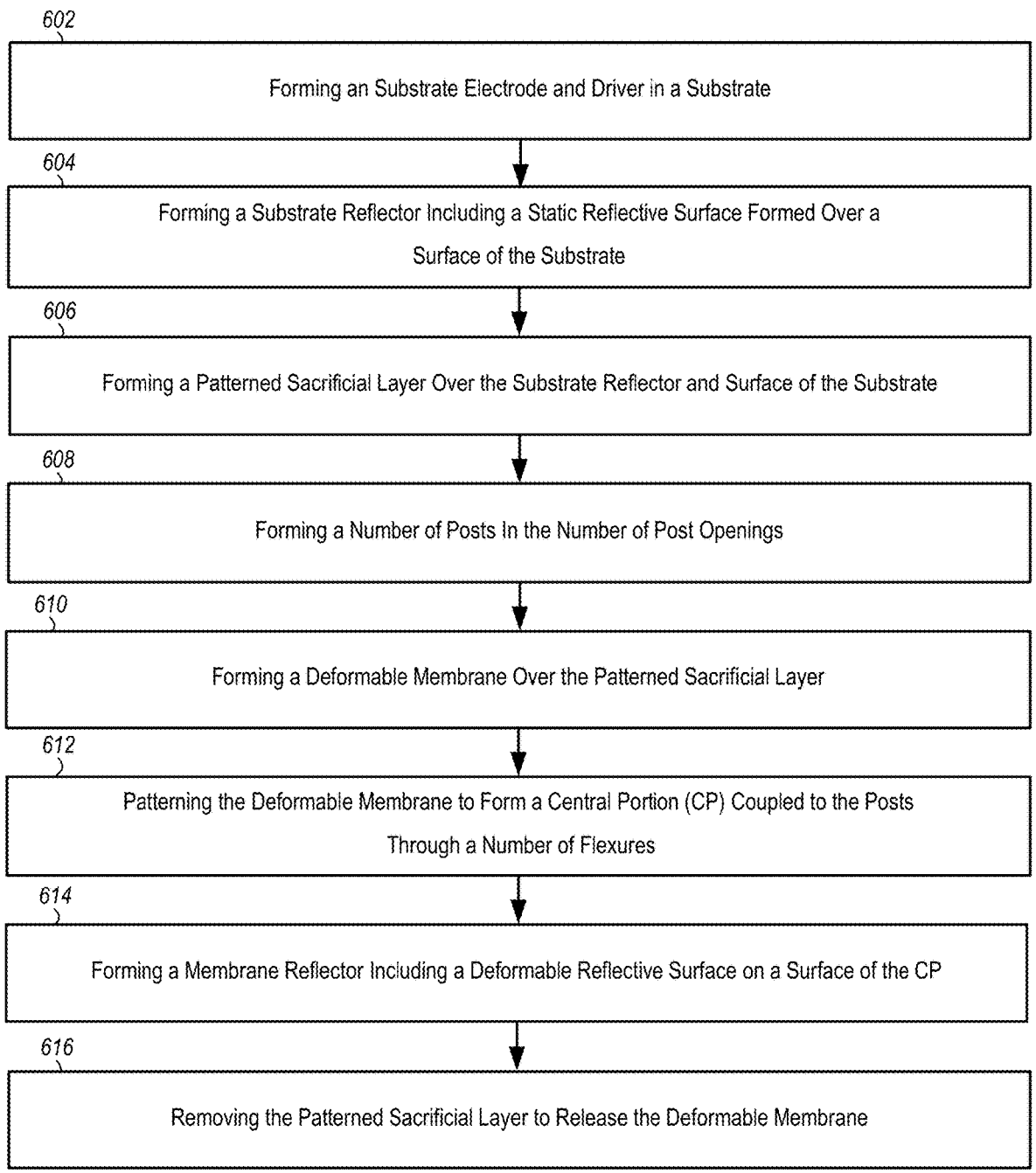
FIG. 6 is a flow chart illustrating an embodiment of a method for fabricating a reflective 2D MEMS light modulator according to the present disclosure.
Figure 7A:
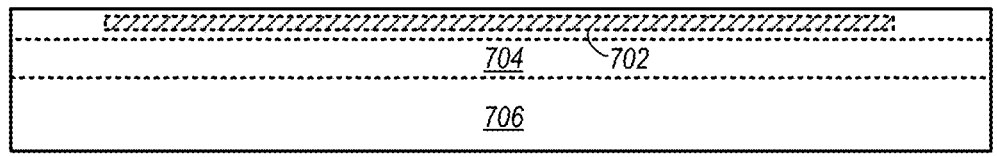
FIGS. 7A-7I are sectional views through a substrate illustrating an embodiment of a fabrication process for a reflective 2D MEMS light modulator according to a method of the present disclosure.

Referring to FIG. 6 and FIG. 7A the process begins with forming a substrate electrode 702 coupled to one of a number drive channels in a drive circuit or driver 704 in a substrate 706 (step 602). The driver 704 can be integrally formed underlying the 2D MEMS light modulator 700, as in the embodiment shown, or formed adjacent thereto. Generally, the driver 704 includes a plurality of metal oxide silicon (MOS) transistors fabricated using conventional semiconductor fabrication processes. A dielectric layer is formed or deposited over the driver 704 and a metal nitride, such as TiN, or a doped polysilicon layer is deposited and patterned in or on a surface of the substrate 706 to form the substrate electrode 702.

Figure 7B:
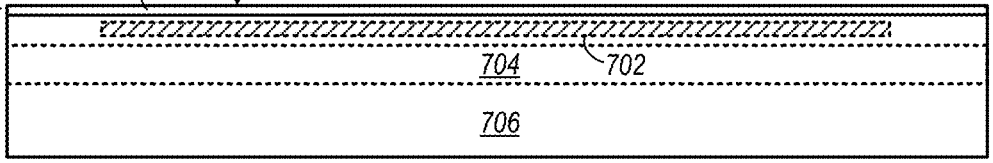

Next referring to FIG. 6 and FIG. 7B, a substrate reflector 708 including a mechanical or structural layer 710 and a static reflective surface 712 is formed over the surface of the substrate 706 (step 604). The structural layer 710 can include a dielectric or semiconducting material, such as silicon (Si), silicon-dioxide (SiO$_2$), silicon nitride (SiN), silicon-oxynitride (SiN) and silicon-germanium (SiGe), deposited using any suitable MEMS fabrication technology including, for example, chemical vapor deposition (CVD), plasma enhanced CVD (PECVD), or atomic layer deposition (ALD) and then planarized a chemical mechanical process (CMP) to provide a planar surface for the subsequent formation of the static reflective surface 712. As noted above the static reflective surface 712 can include a reflective metal such as, aluminum (Al), gold (Au), or silver (Ag), or a multilayer Bragg mirror, deposited using CVD, PECVD, ALD of sputtering.

Figure 7C:
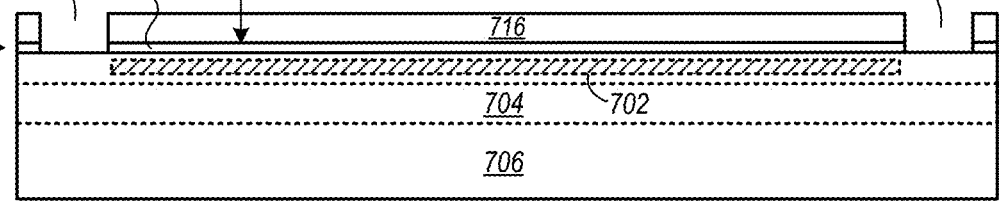

Referring to FIG. 6 and FIG. 7C, a sacrificial layer 716 is deposited over the substrate reflector 708 patterned to form openings 718 for subsequently formed posts (step 606). Generally, as noted above the patterned sacrificial layer has a predetermined thickness selected to provide a deflection gap so that when a deformable reflective surface is deformed into a non-planar surface by electrostatic deflection of a CP, light reflected from a membrane reflector is brought into phase interference with light reflected from a substrate reflector. Suitable predetermined thicknesses for the sacrificial layer 716 can be from about 0.25 µm to about 2.5 µm. Suitable materials for the sacrificial layer 716 can include Ge, amorphous or polycrystalline silicon, and can be deposited using any semiconductor or MEMS fabrication technology including, for example, CVD, PECVD, and ALD. The sacrificial layer 716 is patterned by depositing a mask layer (not shown) over the sacrificial layer and etching the sacrificial layer to form the openings 718, to yield the structure shown in FIG. 7C. The mask layer can include a hardmask of a dielectric material, such as silicon nitride or oxide, or a photoresist mask, deposited and patterned using standard photolithographic techniques. The sacrificial layer 716 can be etched using a wet or dry etch chemistry.

Figure 7D:
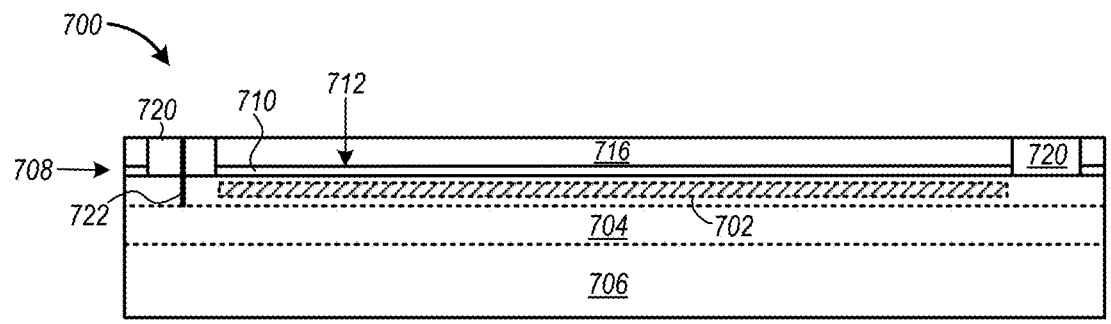

Next, referring to FIG. 6 and FIG. 7D, a number of posts 720 are formed in the number of post openings 718 (step 608). Generally, the posts 720 can include Si, SiO$_2$, SiN, SiON or SiGe, and can be deposited using any semiconductor or MEMS fabrication technology including, for example, CVD, PECVD, and ALD. As noted above, one or more of the posts 720 can be an annular structure including an electrical conductor 722 extending through the post and a surface of the substrate 706 to electrically connect to the driver 704. The electrical conductor 722 can be formed by masking, etching and depositing a metal or electrically conductive material in an opening extending through the post 720 and the substrate 706. Alternatively, one or more of the of post openings 718 can extend through the surface of the substrate 706 to the driver 704, and the material used to form the post 720 can be selected to be electrically conductive, for example, SiGe.

Figure 7E:
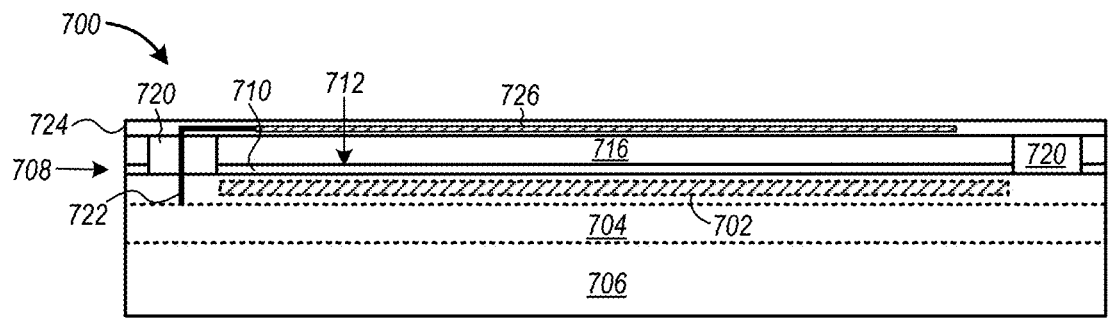

Referring to FIG. 6 and FIG. 7E, a deformable membrane 724 is formed over the patterned sacrificial layer (step 610). As with the structural layer 710 and posts 720 the deformable membrane 724 can one or more layers of include Si, SiO$_2$, SiN, SiON or SiGe, and can be deposited using, for example, CVD, PECVD, or ALD. Generally, forming the deformable membrane 724 includes forming an actuator electrode 726 electrically coupled to the electrical conductor 722. In some embodiments, forming the actuator electrode 726 can include depositing a layer of a metal or conductive material over a first dielectric layer of a material such as Si, SiO$_2$, SiN, or SiON. Optionally, in some embodiments the deformable membrane 724 can further include a second dielectric layer overlying the actuator electrode 726. Alternatively, the material used to form the deformable membrane 724 can be selected to be electrically conductive, for example, SiGe.

Figure 7F:
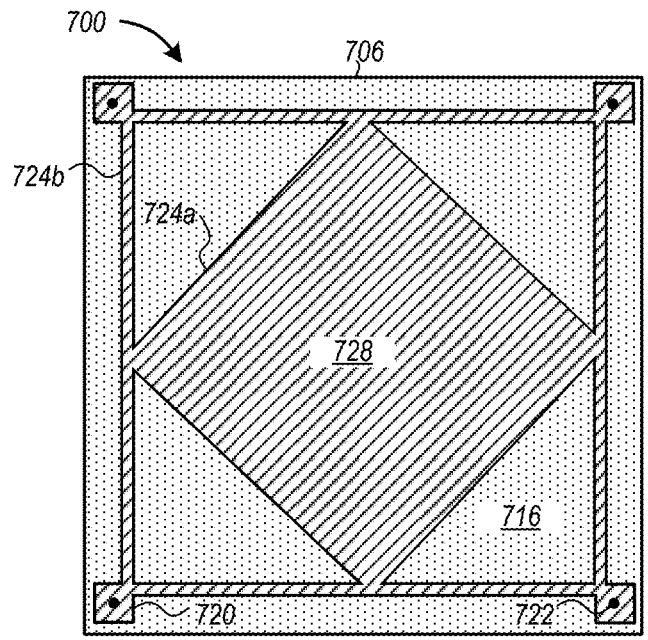

Next, referring to FIG. 6 and FIG. 7F, the deformable membrane 724 is patterned to form a central portion (CP 724a) coupled to the posts through a number of flexures 724b (step 612). Generally, the deformable membrane 724 is patterned using standard MEMS fabrication technology including, for example, masking, photolithography, and wet or dry etching techniques.

Figure 7G:
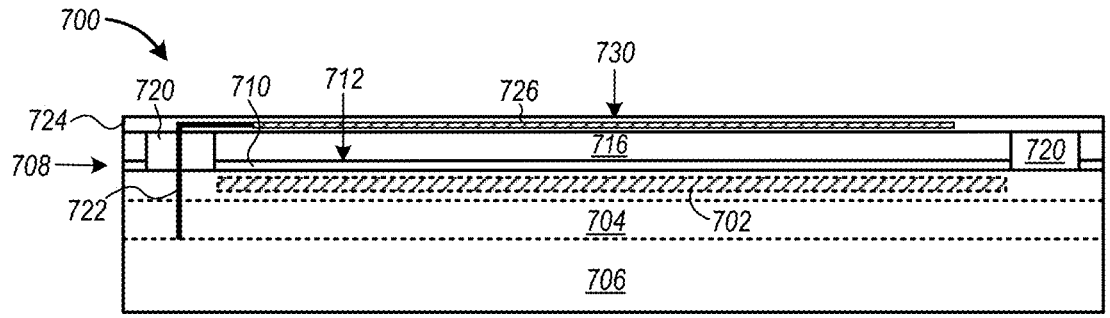

Referring to FIG. 6 and FIG. 7G, a membrane reflector 728 is formed including a deformable reflective surface 730 on a surface of the CP 724a (step 614). Generally, the membrane reflector 728 consists of the CP 724a of the deformable membrane 724 with the deformable reflective surface 730 formed thereon, as shown in FIG. 7G. The deformable reflective surface 730 can include a reflective metal such as, aluminum (Al), gold (Au), or silver (Ag), or a multilayer Bragg mirror, deposited using CVD, PECVD, ALD of sputtering, as described above with respect to the static reflective surface 712. Alternatively, the membrane reflector 728 can further include an additional layer of a taut flexible material (not shown) deposited on the CP 724a of the deformable membrane 724 on which the deformable reflective surface 730 is formed. In yet another embodiment, where the actuator electrode 726 includes a metal layer deposited over a first dielectric layer of the deformable membrane 724, the metal used to form the actuator electrode can be polished to also operate as the deformable reflective surface 730.

Figure 7H:
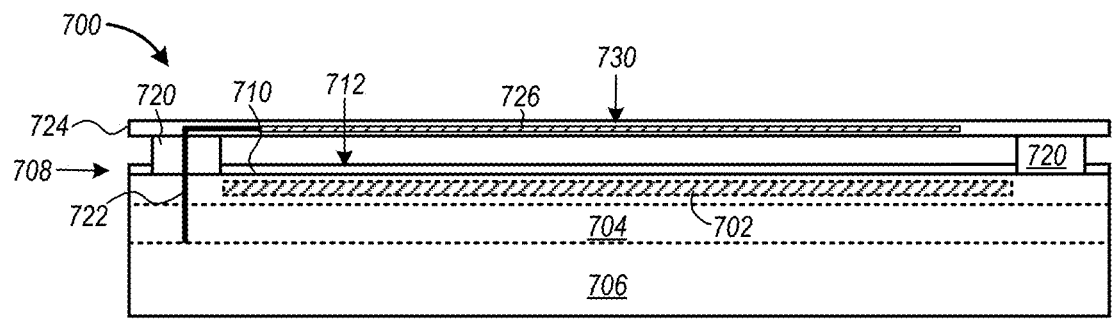

Finally, referring to FIG. 6 and FIG. 7H, the patterned sacrificial layer 716 is removed to release the deformable membrane 724 (step 616). Generally, the patterned sacrificial layer 716 can be removed or etched by a wet etch, using an etch chemistry selective to materials of the posts 720, the deformable membrane 724, and the underlying substrate reflector 708 and substrate 706.

Figure 7I:
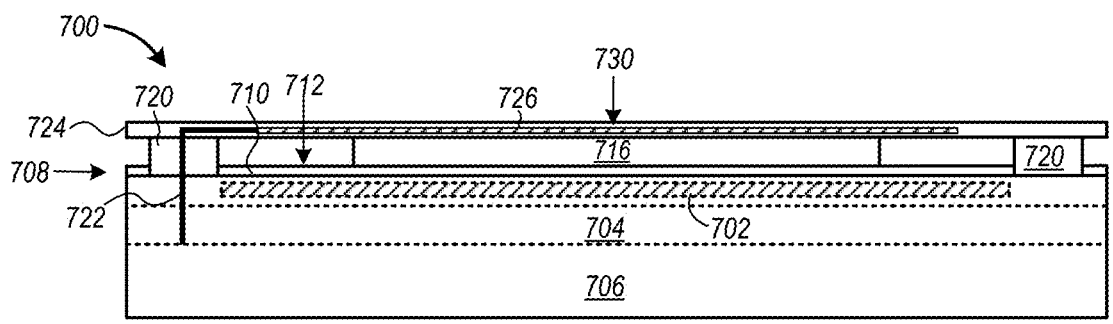

In an alternative embodiment, shown in FIG. 7I, the reflective surfaces 712, 730 of the substrate reflector 708 and membrane reflector 728 are not previously formed in steps 604 and 614, and the patterned sacrificial layer 716 is only partially removed or released in step 616 using a highly selective and anisotropic etch to expose the surface of the substrate between the posts 720, flexures 724b and CP 724a, leaving a portion of the patterned sacrificial layer directly underlying the CP of the deformable membrane 724 in place. Thereafter, the reflective surfaces 712, 730, of a substrate reflector 708 and membrane reflector 728 can be formed in a single step or operation, and the remaining portion of the patterned sacrificial layer 716 removed to release the deformable membrane 724. As described above, the reflective surfaces 712, 730, can include can include a reflective metal, such as aluminum (Al), gold (Au), silver (Ag) or any other suitably reflective metal, deposited by sputtering, or CVD, or a multilayer dielectric or Bragg mirror deposited by CVD, PECVD or ALD.

Figure 8:
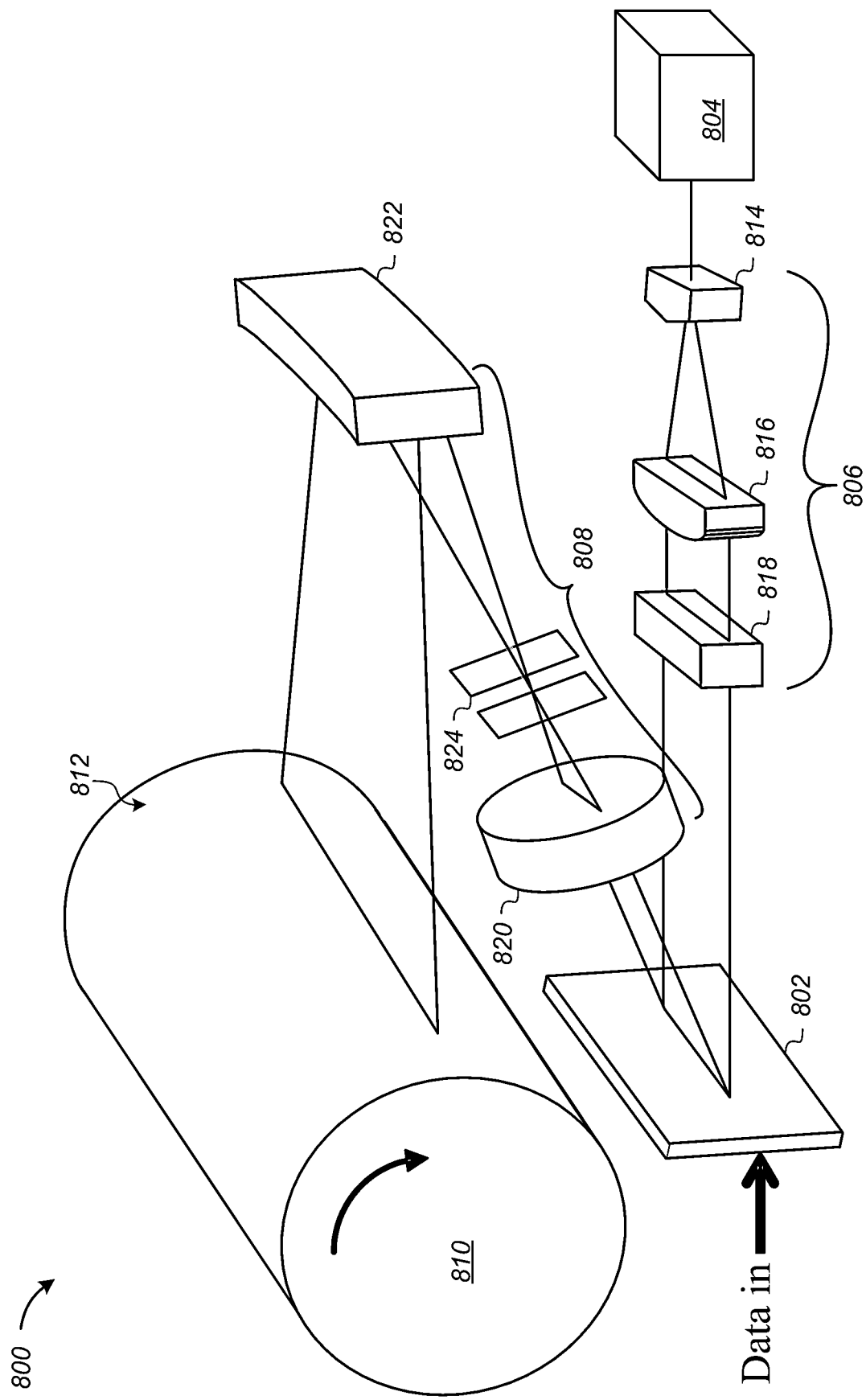
FIG. 8 is a schematic block diagram of a layout for a thermal, computer-to-plate (CtP) printing system including a SLM including a multi-pixel, linear array of reflective 2D MEMS light modulators.

FIG. 8 is a schematic block diagram of a layout for a thermal, computer-to-plate (CtP) printing system including a SLM including a linear array of 2D MEMS light modulators enclosed in a package including a cavity filled with a low molar mass and high thermal conductivity fill gas. Referring to FIG. 8, a printing system or printer 800 including a linear array of 2D light modulators 802, such as shown in FIGS. 2A through 2C, or a multi-pixel, linear array of 2D light modulators, such as shown in FIGS. 3A through 3C and FIG. 4, is shown in FIG. 8. An advantage of using a linear array of 2D light modulators in this application is that it eliminates the need for a scanning mirror and f-θ or scanning optics of conventional SLM by replacing them with a linear array of 2D light modulators 802 sufficiently large along a longitudinal axis to project modulated light over a swath extending substantially across the entire width of an imaging or focal plane. The printer 800 generally comprises an illuminator or light source 804, illumination optics 806, and imaging optics 808 to direct an image (modulated light) from the linear array of 2D light modulators 802 onto a photoconductive or photosensitive surface of an imaging or focal plane on a substrate, shown here as a drum 810 with a photoconductive layer on a surface 812 thereof.

The light source 804 can include any light emitting device capable of continuously emitting light at a sufficient power level or power density, and, preferably at a single or narrow range of wavelengths to enable light reflected from light modulators of the linear array of 2D light modulators 802 to be modulated in phase and/or amplitude by diffraction. In certain printing applications, and in particular in photothermal printers, the light source 804 can include a number of lasers or laser emitters, such as diode lasers, each powered from a common power supply (not shown). Preferably, the light source 804 is a high-power laser capable of operating in ultraviolet (UV) wavelengths of from 355 nanometers (nm) through infrared (IR) wavelengths up to about 2000 nm in either a continuous wave (CW) mode, or in a pulse mode with widths or durations of from about 1 femtoseconds (fs) up to about 500 nanoseconds (ns) at a repetition rate of from about 10 kHz up to about 300 kHz, and at energy ranges of from about 10 microjoules (µJ) up to greater than 10 millijoules (mJ).

The illumination optics 806 can comprise a number of elements including lens integrators, mirrors and prisms, designed to transfer light from the light source 804 to the linear array of 2D light modulators 802 such that a line of a specified length and width is illuminated on the linear array. In the embodiment shown, the illumination optics 806 include a prism 814 and lens 816 to refract and transmit light from the light source 804, and an integrator 818 to illuminate a swath covering substantially the full width of the linear array.

The imaging optics 808 can include magnification elements, such as a Fourier Transform (FT) lens 820 and a FT mirror 822, to direct the light from the linear array of 2D light modulators 802 to the photoconductive layer located on the drum 810. Preferably, the imaging optics 808 is designed to transfer light from the linear array of 2D light modulators 802 to the drum 810 such that a photoconductive layer located on the drum is illuminated across a swath covering substantially the full width of the drum. Optionally, as in the embodiment shown, the imaging optics 808 further includes filter elements, such as a FT filter 824, to resolve light reflected from each pixel but not light reflected from each individual light modulator or diffractor or from each element in each light modulator.

As described above with reference to FIGS. 3A-C and 4, the linear array of 2D light modulators 802 includes a linear array of a number of individual diffractive two-dimensional (2D) densely packed spatial light modulators or diffractors (not shown in this figure). Adjacent 2D light modulators may be grouped or functionally linked to provide a number of pixels in the linear array that can be controlled by drive signals from a single, common drive channel to print to the imaging plane with a desired resolution. Preferably, the linear array of 2D light modulators 802 has a pixel count adequate to cover a swath or strip extending substantially across the entire width of the photo or thermal-sensitive surface of the imaging plane. More preferably, the linear array of 2D light modulators 802 has a pixel count of at least about 500 pixels, and most preferably of at least about 1000 pixels to provide the desired resolution. For example, in one version of the layout illustrated in FIG. 8, the linear array of 2D light modulators 802 includes a sufficient number of pixels to cover an entire swath on a standard eight inch (8") write drum 810 with a printing resolution of about 2000 dots-per-inch (dpi) using a modest-power, 780 nm GaAs diode laser as the light source 804.

In another embodiment, not shown, the printing system is a maskless lithography or photolithography system including a SLM with a linear array of 2D light modulators and further comprising a pattern generator to generate and transmit to the number of 2D light modulators drive signals to manufacture micro-electronic devices. By micro-electronic devices it is meant integrated circuits (ICs) and Micro-Electromechanical System or MEMs devices. In maskless lithography, light used to expose the photosensitive material in an image plane on a substrate, such as silicon or semiconductor wafer, on which the device is to be formed.

Figure 9:
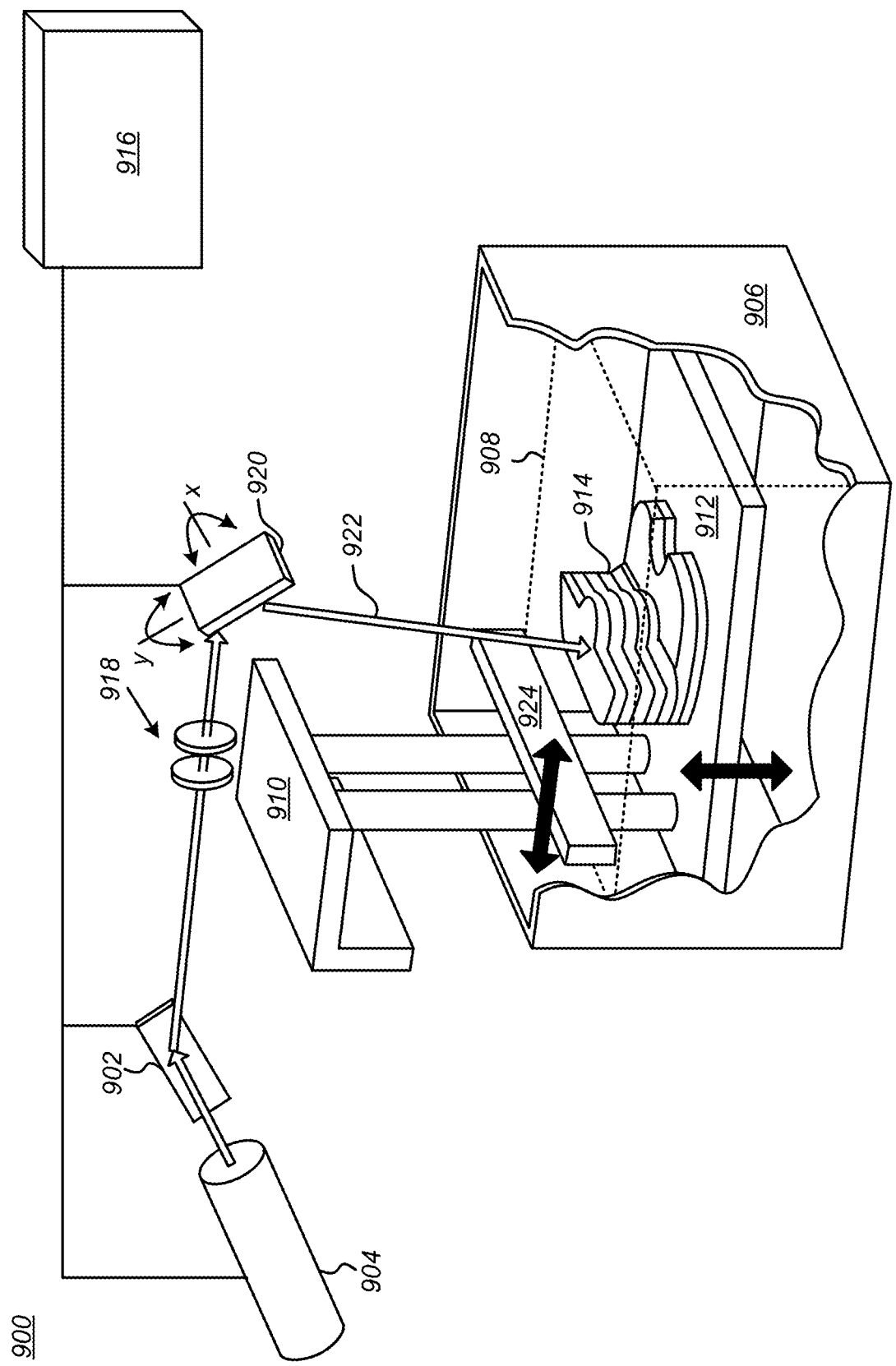
FIG. 9 is a schematic block diagram of an additive manufacturing system including a SLM including a multi-pixel, linear array of reflective 2D MEMS light modulators.

FIG. 9 is a schematic block diagram of a three-dimensional (3D) printing or additive manufacturing system including a SLM with a linear array of 2D light modulators enclosed in a package including a cavity filled with a low molar mass and high thermal conductivity fill gas. Referring to FIG. 9, the 3D printing system 900 generally includes a MEMS-based diffractive SLM 902 with a number of pixels, each with multiple light modulators to modulate a beam of light generated by a laser 904, a vat 906 containing the photopolymer or resin 908 (indicated by dashed lines), and a transport mechanism 910 to raise and lower a work surface 912 on which an object 914 is printed into the vat as indicated by the vertical arrow. As noted above, the laser 904 is preferably a high power laser capable of operating in UV wavelengths of from 355 nm through IR wavelengths up to about 1550 nm in either CW mode at powers of about 500 Watts (W) to greater than about 1 kilowatt (kW), or in a pulse mode with widths or durations of from about 1 fs up to about 500 ns at a repetition rate of from about 10 kHz up to about 300 kHz, and at energy ranges of from about 10 microjoules (µJ) up to greater than 10 millijoules (mJ).

Referring again to FIG. 9, the 3D printing system 900 further includes imaging optics 918 to transfer modulated light from the SLM toward an imaging or focal plane on the work surface 912, a controller 916 to control operation of the laser 904, SLM 902 and transport mechanism 910. In some embodiments, the imaging optics 918 can include magnification and filtering elements, such as a first Fourier Transform (FT) lens to focus and direct light from the SLM 902 onto a scanning mirror 920 that rotates to scan a modulated beam 922 along a x-axis and a y-axis on a surface of the resin 908 immediately above or adjacent to the work surface 912.

The transport mechanism 910 is adapted and controlled by the controller 916 to lower the work surface 912 into the vat 906 as the modulated light converts the liquid resin 908 into a solid, building successive layers or cross-sections of the object 914 to be printed. Generally, the 3D printing system 900 further includes a sweeper 924 adapted to move as indicated by the horizontal arrow to spread or smooth fresh resin 908 over surface sections of the object 914 being printed.

Figure 10:
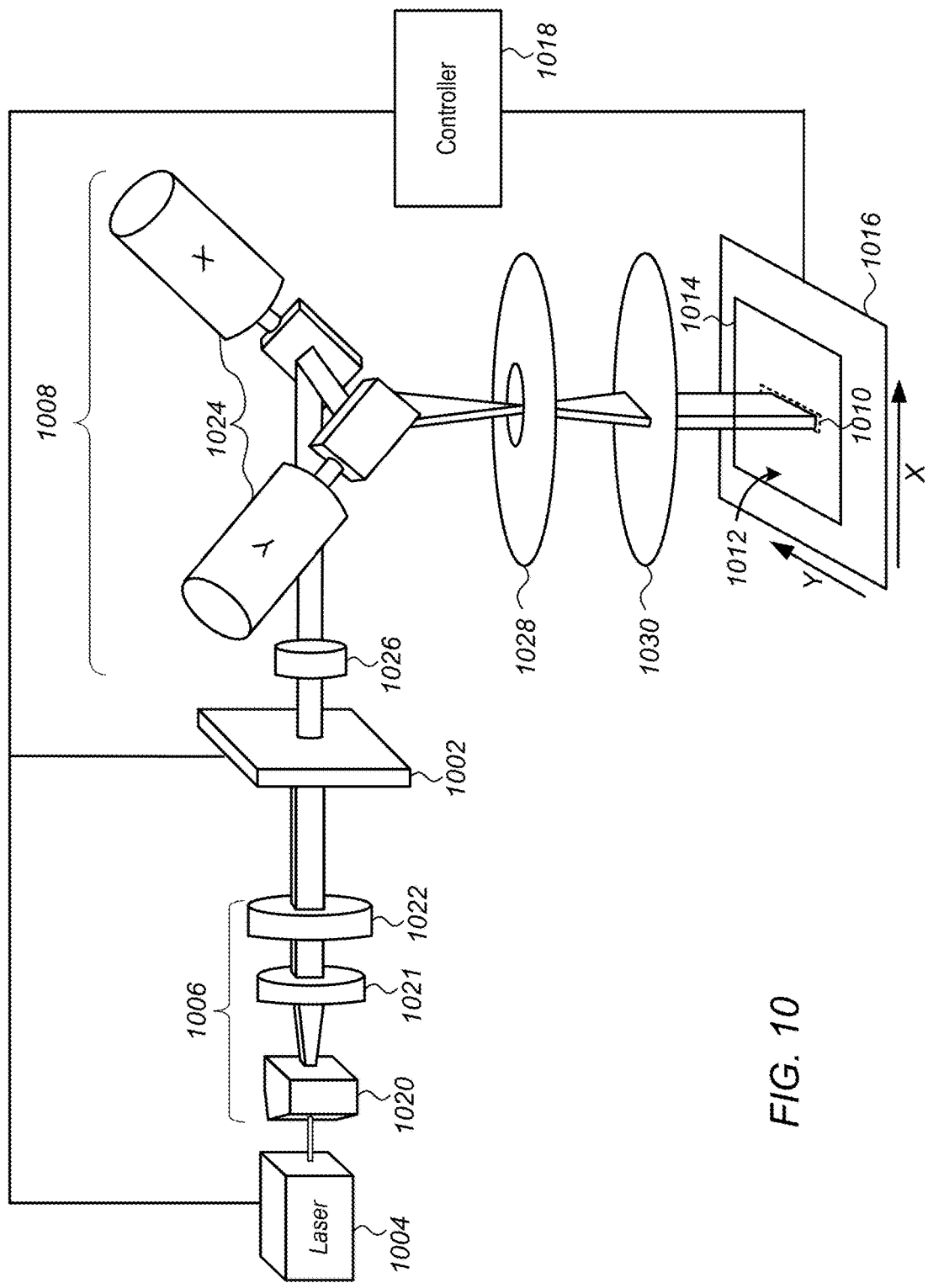
FIG. 10 is a schematic block diagram of an embodiment of a laser marking system including a SLM including a multi-pixel, linear array of reflective 2D MEMS light modulators.

FIG. 10 is a schematic block diagram of an embodiment of a surface modification system, such as a laser marking system, including a SLM with a linear array of 2D light modulators enclosed in a cavity filled with a low molar mass and high thermal conductivity fill gas. FIG. 10 is a schematic block diagram of an embodiment of a laser marking system 1000 including a SLM 1002 with a multi-pixel, linear array of MEMS based light modulators, and galvanometric mirrors for scanning. For purposes of clarity and to simplify the drawings the optical light path is shown as being unfolded causing the SLM 1002 to appear as transmissive. However, it will be understood that because the SLM 1002 is reflective the actual light path is folded to an angle of 90° or less at the SLM.

Referring to FIG. 10, the laser marking system 1000 includes, in addition to the SLM 1002, a laser 1004 operable to generate laser light used to illuminate the SLM, illumination optics 1006 to direct laser light onto the SLM, imaging optics 1008 operable to focus a substantially linear swath of modulated light 1010 onto an imaging or focal plane on a surface 1012 of a workpiece 1014 on or affixed to a fixture 1016 or stage, and a controller 1018 operable to control the SLM, laser and imaging optics to scan the linear swath of modulated light across the surface of the workpiece to record a 2D image thereon.

As noted above, the laser 1004 is preferably a high power laser capable of operating in UV wavelengths of from 355 nm through IR wavelengths up to about 2000 nm in either CW mode, or in a pulse mode with widths or durations of from about 1 fs up to about 500 ns at a repetition rate of from about 10 kHz up to about 300 kHz, and at energy ranges of from about 10 microjoules (µJ) up to greater than 10 millijoules (mJ). In one embodiment particularly useful for laser marking systems the laser 1004 is capable of operating in visible wavelength (λ) of about 514 nm, at pulse energies of from about 200 µJ at a pulse width or duration of about 260 fs and repetition rate of 100 kHz.

The SLM 1002 can include a multi-pixel; linear array of MEMS based, ribbon-type light modulators, such as shown in FIGS. 2A through 2C, or a multi-pixel, linear array of 2D light modulators, such as shown in FIGS. 3A through 3C and FIG. 4.

The illumination optics 1006 can include a beam forming optical system to direct laser light onto the SLM 1002. Referring to FIG. 10, elements of the beam forming optical system can include a Powell lens 1020, a long axis collimating lens 1021, and a cylindrical, short axis focusing lens 1022 to shape or focus the illumination into a rectangular beam or line of illumination extending substantially uniformly across the linear array of the SLM 1002.

The imaging optics 1008 can include galvanometric mirrors 1024 to scan the linear swath of modulated light 1010 across the surface 1012 of the workpiece 1014, a number of cylindrical lens 1026 to direct modulated light to the galvanometric mirrors, and a Fourier aperture 1028 to separate a $0^{th}$ order beam in the modulated light from $1^{st}$ order beams, and a Fourier Transform (FT) lens 1030 to focus the modulated light onto the surface of the workpiece.

Preferably, the cylindrical lens 1026 and FT lens 1030 of the imaging optics include fused silica lenses to reduce thermal focus shift of the modulated light focused onto the surface 1012 of a workpiece 1014. In some embodiments, one or more of the lenses 1020, 1021, 1022 of the illumination optics 1006 can also include fused silica lenses to reduce thermal focus shift of the laser light focused onto the SLM 1002.

The fixture 1016 on which the workpiece 1014 to be marked is placed or affixed can include a static fixture, or a movable stage operable to move or reposition the workpiece relative to a substantially stationary linear swath of modulated light, to scan the linear swath of modulated light across the surface of the workpiece. As noted above, in either embodiment, whether static or movable, the fixture 1016 preferably includes a number of sensors and signaling means to signal other components in the laser marking system when the workpiece is in proper position to be marked.

Depending on the size of the linear swath of modulated light 1010 and/or an image to be recorded it can be recorded on the surface 1012 of a workpiece 1014 in a single scan or single-stripe of the linear swath of modulated light 1010 across the surface along a single axis, or by multiple scans or stripes (multi-stripes) of the linear swath of modulated light across the surface along a first axis perpendicular to a long axis of the linear swath of modulated light, followed by repositioning the linear swath of modulated light along a second axis parallel to the long axis of the linear swath.

Thus, embodiments of a reflective two-dimensional 2D MEMS based SLM and methods for fabricating and operating the same in various applications have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A reflective two-dimensional (2D) Micro-Electromechanical System (MEMS) light modulator comprising:
 a deformable membrane suspended over a surface of a substrate by posts at corners thereof, the deformable membrane including an electrostatically deflectable patterned central portion (CP) and a number of flexures through which the CP is coupled to the posts;
 a membrane reflector including a deformable reflective surface formed on a surface of the CP; and
 a substrate reflector including a static reflective surface formed on a surface of the substrate below the membrane reflector, and exposed through void spaces between the posts, the number of flexures and the CP,
 wherein the membrane reflector is separated from the substrate reflector by a deflection gap selected so that when the deformable reflective surface is deformed into a non-planar surface by electrostatic deflection of the CP, light reflected from the membrane reflector is brought into phase interference with light reflected from the substrate reflector.

2. The 2D MEMS light modulator of claim 1 wherein when the CP is electrostatically deflected such that an integrated amplitude phasor of light reflected from the substrate reflector ($\tilde{A}_{subst}$) and an integrated amplitude phasor of light reflected from the membrane reflector ($\tilde{A}_{memb}$), sum in-phase (phase shift=0) to provide constructive interference and a bright state.

3. The 2D MEMS light modulator of claim 2 wherein a distance between the membrane reflector and substrate reflector in a state is selected so that in a quiescent state with the deformable reflective surface undeformed by electrostatic deflection of the CP, phasors $\tilde{A}_{subst}$ and $\tilde{A}_{memb}$ add destructively to achieve a low-reflectance dark state.

4. The 2D MEMS light modulator of claim 1 wherein when the CP is electrostatically deflected such that an integrated amplitude phasor of light reflected from the substrate reflector ($\tilde{A}_{subst}$), and an integrated amplitude phasor of light reflected from the membrane reflector ($\tilde{A}_{memb}$), sum anti-phase (phase shift=$\pi$) to provide destructive interference and a dark state.

5. The 2D MEMS light modulator of claim 2 wherein a distance between the membrane reflector and substrate reflector in a state is selected so that in a quiescent state with the deformable reflective surface undeformed by electrostatic deflection of the CP, phasors $\tilde{A}_{subst}$ and $\tilde{A}_{memb}$ add constructively to achieve a high-reflectance bright state.

6. The 2D MEMS light modulator of claim 1 wherein the deformable membrane comprises one or more of silicon (Si), silicon-nitride (SiN), silicon-germanium (SiGe), aluminum (Al), aluminum-silicon (AlSi), and aluminum-nitride (AlN).

7. The 2D MEMS light modulator of claim 1 wherein at least one of the deformable reflective surface and the static reflective surface comprise a Bragg mirror.

8. The 2D MEMS light modulator of claim 1 wherein the 2D MEMS light modulator is operable to modulate light ranging from deep ultraviolet light (DUV) to near-infrared (NIR) at wavelengths from 150 nm to 2 μm.

9. The 2D MEMS light modulator of claim 1 wherein modulated light from the 2D MEMS light modulator collected for transmission is either $0^{th}$ order or $1^{st}$ order.

10. A method of fabricating a two-dimensional (2D) Micro-Electromechanical System (MEMS) light modulator, comprising:
 forming a substrate reflector including a static reflective surface formed over a surface of a substrate;
 forming a patterned sacrificial layer over the substrate reflector and surface of the substrate, the patterned sacrificial layer having a predetermined thickness and including a number of post openings extending through the patterned sacrificial layer to the surface of the substrate;
 forming a number of posts in the number of post openings;
 forming a deformable membrane over the number of posts and the patterned sacrificial layer;
 patterning the deformable membrane to form an electrostatically deflectable patterned central portion (CP) and a number of flexures through which the CP is coupled to the posts;
 forming a membrane reflector including a deformable reflective surface on a surface of the CP; and
 removing the patterned sacrificial layer to release the deformable membrane, wherein the CP is separated from the surface of the substrate by a deflection gap equal to the predetermined thickness of the patterned sacrificial layer, and wherein the predetermined thickness is selected so that when the deformable reflective surface is deformed into a non-planar surface by electrostatic deflection of the CP, light reflected from the membrane reflector is brought into phase interference with light reflected from the substrate reflector.

11. The method of claim 10 wherein forming the membrane reflector and substrate reflector comprises forming the membrane reflector and substrate reflector sized and shaped so that the 2D MEMS light modulator is operable in an active state with the deformable reflective surface deformed by electrostatic deflection of the CP, an integrated amplitude phasor of light reflected from the substrate reflector ($\tilde{A}_{subst}$), and an integrated amplitude phasor of light reflected from the membrane reflector ($\tilde{A}_{memb}$), sum in-phase (phase shift=0) to provide constructive interference and a bright state.

12. The method of claim 10 wherein forming the membrane reflector and substrate reflector comprises forming the membrane reflector and substrate reflector sized and shaped so that the 2D MEMS light modulator is operable in an active state with the deformable reflective surface deformed by electrostatic deflection of the CP, an integrated amplitude phasor of light reflected from the substrate reflector ($\tilde{A}_{subst}$), and an integrated amplitude phasor of light reflected from the membrane reflector ($\tilde{A}_{memb}$), sum anti-phase (phase shift=$\pi$) to provide destructive interference and a dark state.

13. The method of claim 10 wherein at least one of the deformable reflective surface or the static reflective surface comprise a Bragg mirror.

14. The method of claim 10 wherein removing the patterned sacrificial layer comprises two separate removal steps including:
 a partial removal of the sacrificial layer overlying the substrate reflector leaving a portion of the sacrificial layer underlying the CP in place; and
 full release of the deformable membrane after simultaneously forming the deformable reflective surface on the CP and the static reflective surface on the substrate reflector.

15. The method of claim 14 wherein simultaneously forming the deformable reflective surface on the CP and the static reflective surface on the substrate reflector comprises depositing a reflective metal.

16. A system comprising:
a light source operable to generate a light beam;
a spatial light modulator (SLM) operable to modulate light incident thereon, the SLM including a multi-pixel, array of two-dimensional (2D) Micro-Electromechanical System (MEMS) light modulators, each 2D MEMS light modulator including:
- a deformable membrane suspended over a surface of a substrate by posts at corners thereof, the deformable membrane including an electrostatically deflectable patterned central portion (CP) and a number of flexures through which the CP is coupled to the posts;
- a membrane reflector including a deformable reflective surface formed on a surface of the CP; and
- a substrate reflector including a static reflective surface formed on a surface of the substrate below the membrane reflector, and exposed through void spaces between the posts, the number of flexures and the CP, wherein the membrane reflector is separated from the substrate reflector by a deflection gap selected so that when the deformable reflective surface is deformed into a non-planar surface by electrostatic deflection of the CP, light reflected from the substrate reflector is brought into phase interference with light reflected from the membrane reflector when the deformable reflective surface is deformed into a non-planar surface by electrostatic deflection of the CP;

imaging optics operable to focus modulated light from the SLM onto a focal plane of the system; and
a controller operable to control the light source, SLM and imaging optics to modulate light incident thereon and to focus and scan the modulated light across the focal plane.

17. The system of claim 16, wherein the system is an additive manufacturing system further comprising:
- a vat into which material being added together is introduced; and
- a transport mechanism to raise and lower a work surface, on which an object is to be manufactured into the vat, wherein the focal plane is on a surface of the material in the vat, and wherein the controller is further operable to control operation of the transport mechanism.

18. The system of claim 16, wherein the system is a surface modification system, the focal plane is on a surface of a workpiece, the light source is a laser, and wherein the imaging optics is operable to focus a substantially linear swath of modulated light onto the surface of the workpiece, the linear swath comprising light from multiple pixels of the SLM, and wherein the controller is operable to control the SLM, laser and imaging optics to mark the surface of the workpiece to record an image thereon.

19. The system of claim 16, wherein the system is a thermal, computer-to-plate (CtP) printing system the focal plane is on a photosensitive surface of a substrate, the light source is a laser, and wherein the imaging optics is operable to focus a substantially linear swath of modulated light onto the photosensitive surface of the substrate, the linear swath comprising light from multiple pixels of the SLM, and wherein the controller is operable to control the SLM, laser and imaging optics to print to the surface of the substrate to record an image thereon.

* * * * *